United States Patent [19]

Kimura et al.

[11] Patent Number: 6,083,415
[45] Date of Patent: Jul. 4, 2000

[54] PIEZOELECTRIC CERAMIC COMPOSITION

[75] Inventors: Masahiko Kimura, Shiga-ken; Akira Ando, Omihachiman, both of Japan

[73] Assignee: Murata Manufacturing Co., Japan

[21] Appl. No.: 09/252,576

[22] Filed: Feb. 18, 1999

[30] Foreign Application Priority Data

Feb. 18, 1998 [JP] Japan .................................. 10-035714
Feb. 18, 1998 [JP] Japan .................................. 10-035716

[51] Int. Cl.$^7$ ..................... H01L 41/00; C04B 35/495; C04B 35/499
[52] U.S. Cl. .................. 252/62.9 R; 252/62.9 PZ; 501/134; 501/135; 501/136; 501/137
[58] Field of Search ................ 252/62.7 R, 62.9 PZ; 501/136.134, 139.137

[56] References Cited

U.S. PATENT DOCUMENTS 5,476,720 12/1995 Gunter et al. .................. 501/134

*Primary Examiner*—C. Melissa Koslow
*Attorney, Agent, or Firm*—Ostrolenk, Faber, Gerb & Soffen, LLP

[57] ABSTRACT

The present invention provides a piezoelectric ceramic composition which predominantly comprises a composition represented by the following formula:

$$(1-n)(K_{1-x-y}Na_xLi_y)_m(Nb_{1-z}Ta_z)O_3 - nM1M2M3O_3$$

wherein M1 represents a trivalent metal element such as Bi; M2 represents a monovalent metal element such as K, Na or Li; M3 represents a tetravalent metal element such as Ti, Zr, Sn or Hf; and x, y, z, m, and n satisfy the following conditions: $0.9 \leq x$; $y \leq 0.3$; $x+y<0.75$; $0 \leq z \leq 0.3$; $0.98 \leq m \leq 1.0$; and $0<n<0.1$.

9 Claims, No Drawings

PIEZOELECTRIC CERAMIC COMPOSITION

BACKGROUND OF THE INVENTION

1. Field of the Invention

The present invention relates to a piezoelectric ceramic composition, particularly to a piezoelectric ceramic composition useful as a material for piezoelectric ceramic elements such as piezoelectric ceramic filters and piezoelectric ceramic oscillators.

2. Background Art

Piezoelectric ceramic compositions predominantly comprising lead titanate zirconate ($Pb(Ti_xZr_{1-x})O_3$) or lead titanate ($PbTiO_3$) have been widely used for piezoelectric ceramic elements such as piezoelectric ceramic filters. In the production step for these types of piezoelectric ceramic compositions, lead oxide is generally used. However, vaporization of lead oxide causes deteriorated uniformity in characteristics of the produced elements.

In contrast, piezoelectric ceramic compositions predominantly comprising potassium sodium lithium niobate represented by a formula such as $(K_{1-x-y}Na_xLi_y)NbO_3$ do not cause the above problem, since they contain no lead oxide. Some such compositions comprising potassium sodium lithium niobate have a high electromechanical coupling coefficient $K_p$ and are considered to be promising materials for producing piezoelectric ceramic elements such as piezoelectric ceramic filters and piezoelectric ceramic oscillators.

However, the piezoelectric ceramic compositions predominantly comprising potassium sodium lithium niobate have a relative dielectric constant lower than that of lead titanate zirconate or lead titanate. Therefore, when they are used as materials for piezoelectric ceramic elements such as piezoelectric ceramic filters and piezoelectric ceramic oscillators, impedance-matching with a circuit including the ceramic elements is poor and circuit design sometimes become difficult.

When a piezoelectric ceramic composition is used in a high-frequency region, the following problems arise. Since a piezoelectric ceramic composition predominantly comprising lead titanate zirconate generally has a relatively high relative dielectric constant (approximately 1000–2000), impedance decreases in the high-frequency region of, for example, more than 100 MHz to cause difficulty in use in such a high-frequency region.

In contrast, piezoelectric ceramic compositions predominantly comprising lead titanate ($PbTiO_3$) generally have a relative dielectric constant of approximately 200, which is lower than that of the above piezoelectric ceramic compositions predominantly comprising lead titanate zirconate. Therefore, the compositions comprising lead titanate ($PbTiO_3$) are known to be useful in the high-frequency region. However, an even lower relative dielectric constant is desired for use in a higher high-frequency region.

In addition, piezoelectric ceramic compositions predominantly comprising lead titanate zirconate or lead titanate have a resonance frequency of vibration in the thickness direction as low as approximately 2000–2500 Hz·m. Therefore, when such a piezoelectric ceramic composition is processed into a thin slice so as to form a vibrator, the vibrator must be used in a limited frequency band.

In contrast, some of the piezoelectric ceramic compositions predominantly comprising potassium sodium lithium niobate represented by the formula $(K_{1-x-y}Na_xLi_y)NbO_3$ have a resonance frequency of vibration in a thickness direction as low as approximately 3000–3500 Hz·m and a relative dielectric constant of approximately 100, which is lower than that of lead titanate. Therefore, some of the compositions are known to be used as a material which has characteristics more advantageous than those of lead titanate zirconate or lead titanate in consideration of the use thereof in a high-frequency region.

However, the piezoelectric ceramic compositions predominantly comprising potassium sodium lithium niobate have a large temperature-dependent factor of resonance frequency of vibration in the thickness direction as high as approximately 150–300 ppm. This factor is referred to as fr-TC, and represents an important characteristic of a material for piezoelectric ceramic filters and piezoelectric ceramic oscillators. Therefore, these piezoelectric ceramic compositions have not yet been used widely in practice compared with lead titanate zirconate, lead titanate, etc.

The above-described temperature-dependent factor of resonance frequency of vibration in a thickness direction represented by fr-TC is calculated from the following equation:

$$\text{fr-TC} = (\text{fr}_{max} - \text{fr}_{min})/(\text{fr}_{20} \cdot 100)$$

wherein $\text{fr}_{max}$ represents the maximum resonance frequency of vibration in the thickness direction within a temperature range of –20° C. to +80° C.; $\text{fr}_{min}$ represents the minimum resonance frequency of vibration in the thickness direction within a temperature range of –20° C. to +80° C.; and $\text{fr}_{20}$ represents the resonance frequency of vibration in the thickness direction at 20° C.

SUMMARY OF THE INVENTION

The present invention has been achieved in an attempt to solve the above-mentioned problems with piezoelectric ceramic compositions predominantly comprising potassium sodium lithium niobate.

Accordingly, an object of the present invention is to provide a lead-free piezoelectric ceramic composition which has an enhanced relative dielectric constant of 1000 or more and an electromechanical coupling coefficient represented by $K_p$ of a practically sufficient value, e.g., 25% or more.

Another object of the present invention is to provide a piezoelectric ceramic composition in which the temperature-dependent factor of resonance frequency represented by fr-TC is favorable, i.e., 100 ppm or less, and the relative dielectric constant is 180 or less, and which composition is suitably used in a high-frequency region and under the conditions that the temperature-dependent factor of resonance frequency of vibration in a thickness direction is 3000 Hz·m or more.

Broadly, the present invention provides a piezoelectric ceramnic composition represented by the formula:

$$(1-n)(K_{1-x-y}Na_xLi_y)_m(Nb_{1-z}Ta_z)O_3\text{-}nM1M2M3O_3$$

wherein M1 represents a trivalent metal element; M2 represents a monovalent metal element; M3 represents a tetravalent metal element; and x, y, z, m, and n satisfy the following conditions: $0.9 \leq x$; $y \leq 0.3$; $x+y \leq 0.75$; $0 \leq z \leq 0.3$; $0.98 \leq m \leq 1.0$; and $0 < n \leq 0.1$.

In a first aspect of the present invention, there is provided a piezoelectric ceramic composition which predominantly comprises a composition represented by the following formula:

$$(1-n)(K_{1-x-y}Na_xLi_y)_m(Nb_{1-z}Ta_z)O_3\text{-}nM1M2M3O_3$$

wherein M1 represents a trivalent metal element; M2 represents a monovalent metal element; M3 represents a tetravalent metal element; and x, y, z, m and n satisfy the following conditions: $0.1 \leq x$; $y \leq 0.3$; $x+y<0.75$; $0 \leq z \leq 0.3$; $0.98 \leq m \leq 1.0$; and $0<n<0.1$.

Preferably, M1 is Bi, M2 is at least one element selected from the group consisting of K, Na and Li, and M3 is at least one element selected from the group consisting of Ti, Zr, Sn and Hf.

According to the first aspect of the present invention, there can be obtained a piezoelectric ceramic composition having excellent characteristics, e.g., a relative dielectric constant of 1000 or more, an electromechanical coupling coefficient represented by $K_p$ of 25% or more, and a Curie point of more than 200° C.

In a second aspect of the present invention, there is provided a piezoelectric ceramic composition which predominantly comprises a composition represented by the following formula:

$$(1-n)(K_{1-x-y}Na_xLi_y)_m(Nb_{1-z}Ta_z)O_3-nM1M2M3O_3$$

wherein M1 represents a trivalent metal element; M2 represents a monovalent metal element; M3 represents a tetravalent metal element; and x, y, z, m and n satisfy the following conditions: $x \leq 0.9$; $0.02 \leq y \leq 0.3$; $0.75 \leq x+y$; $0 \leq z \leq 0.3$; $0.98 \leq m \leq 1.0$; and $0<n \leq 0.05$.

Preferably, M1 is Bi, M2 is at least one element selected from the group consisting of K, Na and Li, and M3 is at least one element selected from the group consisting of Ti, Zr, Sn and Hf.

According to the second aspect of the present invention, there can be obtained a piezoelectric ceramic composition having excellent characteristics, e.g., a temperature-dependent factor of resonance frequency represented by fr-TC of 100 ppm or less and a Curie point of more than 200° C. and which composition is suitably used in a high-frequency region and under the conditions that the relative dielectric constant is 180 or less and the temperature-dependent factor of resonance frequency of vibration in the thickness direction is 3000 Hz·m or more.

By use of the piezoelectric ceramic composition according to the first or the second aspect of the present invention, piezoelectric ceramic elements such as piezoelectric ceramic filters and piezoelectric ceramic oscillators are advantageously produced.

DETAILED DESCRIPTION OF THE PREFERRED EMBODIMENTS

As described above, the piezoelectric ceramic composition according to the present invention predominantly comprises a composition represented by the following formula:

$$(1-n)(K_{1-x-y}Na_xLi_y)_m(Nb_{1-z}Ta_z)O_3-nM1M2M3O_3.$$

With reference to the first aspect of the present invention, the reasons why the parameters are limited to the given ranges will next be described.

The x and y are limited such that $0.1 \leq x$ and $y \leq 0.3$ because when x and y fall outside the ranges, sintered products are unsatisfactory. The x+y is limited such that x+y<0.75 because when x+y is 0.75 or more, the electromechanical coupling coefficient represented by $K_p$ decreases to less than 25% to thereby result in difficulty in application of the composition to a material for piezoelectric ceramic filters, piezoelectric ceramic oscillators, etc.

The z is limited such that $0 \leq z \leq 0.3$. When z falls outside the range, the Curie point decreases to 200° C. or less to cause a problem in variation of characteristics with respect to temperature change of elements formed of the piezoelectric ceramic composition according to the present invention.

The m is limited such that $0.98 \leq m \leq 1.0$. When m falls outside the range, polarization treatment of a fired piezoelectric ceramic composition is difficult.

The n is limited such that $0 \leq n \leq 0.1$. When n is 0.1 or more, the electromechanical coupling coefficient represented by $K_p$ decreases to less than 25% to thereby result in difficulty in application of the composition to a material for piezoelectric ceramic filters, piezoelectric ceramic oscillators, etc.

With reference to the second aspect of the present invention, the reasons why the parameters are limited to the given ranges will next be described.

The x and y are limited such that $x \leq 0.9$ and $0.02 \leq y \leq 0.3$. When x and y fall outside the ranges, sintered products are unsatisfactory. The value x+y is limited such that $0.75 \leq x+y$. When x+y is less than 0.75, relative dielectric constant is in excess of 180, to thereby lose the advantages in application of the composition in a high-frequency region.

The z is limited such that $0 \leq z \leq 0.3$. When z falls outside the range, the Curie point decreases to 200° C. or less to cause a problem in variation of characteristics with respect to temperature change of elements formed of the piezoelectric ceramic composition according to the present invention.

The m is limited such that $0.98 \leq m \leq 1.0$. When m falls outside the range, polarization treatment of a fired piezoelectric ceramic composition is difficult.

The n is limited such that $0<n<0.05$. When n is in excess of 0.05, the Curie point decreases to 200° C. or less to cause a problem in variation of characteristics with respect to temperature change of elements formed of the piezoelectric ceramic composition according to the present invention.

EXAMPLES

The present invention will next be described in detail by way of examples, which should not be construed as limiting the invention thereto.

Example 1

$K_2CO_3$, $Na_2CO_3$, $Li_2CO_3$, $Nb_2O_5$, $Ta_2O_5$, $Bi_2O_3$, $TiO_2$ and $ZrO_2$ were provided as starting raw materials and were weighed so as to form compositions of the formula $(1-n)(K_{1-x-y}Na_xLi_y)_m(Nb_{1-z}Ta_z)O_3-nM1M2M3O_3$ shown in Table 1. For each sample, the starting materials were wet-mixed in alcohol for about four hours by use of a ball mill, and the resultant mixture was dried, and then calcined at 700–900° C. Subsequently, the dried mixture was roughly crushed, wet-milled with an appropriate amount of an organic binder for four hours by use of a ball mill, and passed through a 40-mesh sieve to thereby adjust the particle size of the milled powder.

Subsequently, the particle-size-adjusted powder was molded at 1000 kg/cm² into a disk having a diameter of 12 mm and a thickness of 1.2 mm, and the disk was fired at 1050° C.–1300° C. through a customary method for firing to thereby form a ceramic disk. Subsequently, silver electrodes were formed on both sides of the ceramic disk by applying and burning a silver paste through customary methods. The disk was subjected to a polarization treatment by the application of a DC voltage of 2–10 kV/mm for 10–30 minutes in a 50° C.–150° C. insulating oil to thereby obtain a piezoelectric ceramic disk serving as a sample.

Relative dielectric constant, electromechanical coupling coefficient represented by $K_p$ and Curie point were measured for the obtained samples. The results are shown in Table 1.

TABLE 1

| Sample No. | M1 | M2 | M3 | x mol | y mol | z mol | m mol | n mol | Relative Dielectric Constant | Electromechanical coupling coefficient $K_p$ (%) | Curie Point (° C.) |
|---|---|---|---|---|---|---|---|---|---|---|---|
| *1 | Bi | Na | Ti | 0.7 | 0.1 | 0 | 1 | 0.05 | 930 | 21.0 | 440 |
| *2 | — | — | — | 0.6 | 0.1 | 0 | 1 | 0 | 580 | 36.5 | 400 |
| 3 | Bi | Na | Ti | 0.6 | 0.1 | 0 | 1 | 0.05 | 1130 | 31.0 | 380 |
| 4 | Bi | Na | Ti | 0.6 | 0.1 | 0 | 1 | 0.09 | 1380 | 26.5 | 340 |
| *5 | Bi | Na | Ti | 0.6 | 0.1 | 0 | 1 | 0.1 | 1350 | 22.5 | 270 |
| *6 | — | — | — | 0.4 | 0.1 | 0 | 1 | 0 | 650 | 35.5 | 370 |
| 7 | Bi | Na | Ti | 0.4 | 0.1 | 0 | 1 | 0.05 | 1210 | 29.5 | 290 |
| 8 | Bi | Na | Ti | 0.4 | 0.1 | 0 | 1 | 0.09 | 1340 | 26.5 | 225 |
| *9 | Bi | Na | Ti | 0.4 | 0.1 | 0 | 1 | 0.1 | 1420 | 23.0 | 205 |
| *10 | — | — | — | 0.1 | 0.1 | 0 | 1 | 0 | 350 | 28.0 | 405 |
| 11 | Bi | Na | Ti | 0.1 | 0.1 | 0 | 1 | 0.05 | 1015 | 26.0 | 345 |
| 12 | Bi | Na | Ti | 0.1 | 0.1 | 0 | 1 | 0.09 | 1265 | 25.0 | 280 |
| *13 | Bi | Na | Ti | 0.1 | 0.1 | 0 | 1 | 0.1 | 1350 | 20.5 | 255 |
| *14 | Bi | Na | Ti | 0.05 | 0.1 | 0 | 1 | 0.05 | | Poor sintering | |
| *15 | Bi | Na | Ti | 0.4 | 0.4 | 0 | 1 | 0.05 | | Poor sintering | |
| *16 | — | — | — | 0.4 | 0.3 | 0 | 1 | 0 | 470 | 27.5 | 380 |
| 17 | Bi | Na | Ti | 0.4 | 0.3 | 0 | 1 | 0.05 | 1200 | 26.0 | 320 |
| 18 | Bi | Na | Ti | 0.4 | 0.3 | 0 | 1 | 0.09 | 1270 | 25.0 | 235 |
| *19 | Bi | Na | Ti | 0.4 | 0.3 | 0 | 1 | 0.1 | 1345 | 21.0 | 215 |
| *20 | — | — | — | 0.4 | 0 | 0 | 1 | 0 | 420 | 37.0 | 375 |
| 21 | Bi | Na | Ti | 0.4 | 0 | 0 | 1 | 0.05 | 1120 | 30.0 | 300 |
| 22 | Bi | Na | Ti | 0.4 | 0 | 0 | 1 | 0.09 | 1290 | 27.5 | 265 |
| *23 | Bi | Na | Ti | 0.4 | 0 | 0 | 1 | 0.1 | 1400 | 23.0 | 250 |
| *24 | — | — | — | 0.4 | 0 | 0.1 | 1 | 0 | 505 | 39.0 | 365 |
| 25 | Bi | Na | Ti | 0.4 | 0 | 0.1 | 1 | 0.05 | 1200 | 32.5 | 305 |
| 26 | Bi | Na | Ti | 0.4 | 0 | 0.1 | 1 | 0.09 | 1275 | 26.5 | 265 |
| *27 | Bi | Na | Ti | 0.4 | 0 | 0.1 | 1 | 0.1 | 1330 | 23.5 | 250 |
| *28 | — | — | — | 0.4 | 0 | 0.3 | 1 | 0 | 570 | 36.0 | 315 |
| 29 | Bi | Na | Ti | 0.4 | 0 | 0.3 | 1 | 0.05 | 1210 | 30.5 | 255 |
| 30 | Bi | Na | Ti | 0.4 | 0 | 0.3 | 1 | 0.09 | 1270 | 25.0 | 235 |
| *31 | Bi | Na | Ti | 0.4 | 0 | 0.3 | 1 | 0.1 | 1320 | 21.5 | 220 |
| *32 | Bi | Na | Ti | 0.4 | 0 | 0.4 | 1 | 0.05 | 1570 | 31.0 | 180 |
| *33 | — | — | — | 0.4 | 0 | 0 | 0.98 | 0 | 425 | 40.5 | 380 |
| 34 | Bi | Na | Ti | 0.4 | 0 | 0 | 0.98 | 0.05 | 1020 | 36.5 | 305 |
| 35 | Bi | Na | Ti | 0.4 | 0 | 0 | 0.98 | 0.09 | 1240 | 28.5 | 285 |
| *36 | Bi | Na | Ti | 0.4 | 0 | 0 | 0.98 | 0.1 | 1290 | 23.5 | 265 |
| *37 | Bi | Na | Ti | 0.4 | 0 | 0 | 0.97 | 0.05 | | Not polarized | |
| 38 | Bi | Li | Ti | 0.4 | 0 | 0 | 1 | 0.05 | 1030 | 29.0 | 300 |
| 39 | Bi | Li | Ti | 0.4 | 0 | 0 | 1 | 0.09 | 1190 | 26.0 | 265 |
| *40 | Bi | Li | Ti | 0.4 | 0 | 0 | 1 | 0.1 | 1305 | 21.5 | 250 |
| 41 | Bi | Na | Zr | 0.4 | 0 | 0 | 1 | 0.05 | 1150 | 28.5 | 295 |
| 42 | Bi | Na | Zr | 0.4 | 0 | 0 | 1 | 0.09 | 1315 | 27.0 | 260 |
| *43 | Bi | Na | Zr | 0.4 | 0 | 0 | 1 | 0.1 | 1430 | 22.0 | 245 |

In Table 1, samples marked with * fall outside the scope of the present invention.

Samples satisfying all the following conditions: $0.1 \leq x$; $y \leq 0.3$; $x+y<0.75$; $0 \leq z \leq 0.3$; $0.98 \leq m \leq 1.0$; and $0<n<0.1$ in Table 1 exhibit excellent characteristics. Briefly, all samples according to the present invention (those not marked with *) have a relative dielectric constant of 1000 or more, an electromechanical coupling coefficient represented by $K_p$ of 25% or more and a Curie point of more than 200° C.

In contrast, Sample Nos. 14 and 15, which fail to satisfy either the condition $0.1 \leq x$ or the condition $y \leq 0.3$, exhibited poor sinterability.

Sample No. 1, which satisfies the condition $0.1 \leq x$ or $y \leq 0.3$ and does not satisfy the condition $x+y<0.75$, has an electromechanical coupling coefficient represented by $K_p$ of 21.0%. Sample No. 1 also has a relative dielectric constant of 930. As shown by the data, Sample No. 1 does not attain a relative dielectric constant of 1000 or more and electromechanical coupling coefficient represented by $K_p$ of 25% or more.

Sample No. 32, which does not satisfy the condition $0 \leq z \leq 0.3$, has a Curie point of 180° C. and thus does not attain a Curie point of more than 200° C.

Sample No. 37, which does not satisfy the condition $0.98 \leq m \leq 1.0$, does not attain desirable polarization.

Among the samples which do not satisfy the condition $0<n<0.1$, Sample Nos. 5, 9, 13, 19, 23, 27, 31, 36, 40 and 43 having an n of 0.1 or more have an electromechanical coupling coefficient represented by $K_p$ of lower than 25% and Sample Nos. 2, 6, 10, 16, 20, 24, 28 and 33 having an n of 0 do not attain a relative dielectric constant of 1000 or more.

In Example 1, Bi was used as M1; Na or Li was used as M2, and Ti or Zr was used as M3. However, the inventors confirmed that equivalent effects can be realized when K is used as M2 and Sn and/or Hf are used as M3. Other trivalent metals, monovalent metals, and tetravalent metals may also be used as M1, M2 and M3, respectively.

As demonstrated by this Example, the first aspect of the present invention provides a piezoelectric ceramic composition exhibiting excellent characteristics; an enhanced relative dielectric constant of 1000 or more, an electromechanical coupling coefficient represented by $K_p$ of 25% or more and a Curie point of higher than 200° C. Therefore, by use of the piezoelectric ceramic composition according to the first aspect of the present invention, piezoelectric ceramic elements such as piezoelectric ceramic filters and piezoelectric ceramic oscillators are advantageously produced.

Example 2

$K_2CO_3$, $Na_2CO_3$, $Li_2CO_3$, $Nb_2O_5$, $Ta_2O_5$, $Bi_2O_3$, $TiO_2$ and $ZrO_2$ were provided as starting raw materials and were weighed so as to form compositions of the formula $(1-n)(K_{1-x-y}Na_xLi_y)_m(Nb_{1-z}Ta_z)O_3 \cdot nM1M2M3O_3$ shown in Tables 2 and 3. For each sample, the starting materials were wet-mixed in alcohol for about four hours by use of a ball mill, the resultant mixture was dried, and then calcined at 700–900° C. Subsequently, the dried mixture was roughly crushed, wet-milled with an appropriate amount of an organic binder for four hours by use of a ball mill, and passed through a 40-mesh sieve to thereby adjust the particle size of the milled powder.

Subsequently, the particle-size-adjusted powder was molded at 1000 kg/cm² into a disk having a diameter of 12 mm and a thickness of 1.2 mm, and the disk was fired at 1050° C.–1300° C. through a customary method for firing to thereby form a ceramic disk. Subsequently, silver electrodes were formed on both sides of the ceramic disk by applying and burning a silver paste through customary methods. The disk was subjected to a polarization treatment by the application of a DC voltage of 2–10 kV/mm for 10–30 minutes in a 50° C.–150° C. insulating oil to thereby obtain a piezoelectric ceramic disk serving as a sample.

TABLE 2

| Sample No. | M1 | M2 | M3 | x mol | y mol | z mol | m mol | n mol |
|---|---|---|---|---|---|---|---|---|
| *101 | Bi | Na | Ti | 0.95 | 0.05 | 0 | 1 | 0.01 |
| *102 | — | — | — | 0.9 | 0.1 | 0 | 1 | 0 |
| 103 | Ca | Na | Ti | 0.9 | 0.1 | 0 | 1 | 0.01 |
| 104 | Ca | Na | Ti | 0.9 | 0.1 | 0 | 1 | 0.05 |
| *105 | Ca | Na | Ti | 0.9 | 0.1 | 0 | 1 | 0.06 |
| *106 | — | — | — | 0.85 | 0.15 | 0 | 1 | 0 |
| 107 | Ca | Na | Ti | 0.85 | 0.15 | 0 | 1 | 0.01 |
| 108 | Ca | Na | Ti | 0.85 | 0.15 | 0 | 1 | 0.02 |
| 109 | Ca | Na | Ti | 0.85 | 0.15 | 0 | 1 | 0.05 |
| *110 | Ca | Na | Ti | 0.85 | 0.15 | 0 | 1 | 0.06 |
| *111 | — | — | — | 0.8 | 0.2 | 0 | 1 | 0 |
| 112 | Ca | Na | Ti | 0.8 | 0.2 | 0 | 1 | 0.01 |
| 113 | Ca | Na | Ti | 0.8 | 0.2 | 0 | 1 | 0.05 |
| *114 | Ca | Na | Ti | 0.8 | 0.2 | 0 | 1 | 0.06 |
| *115 | — | — | — | 0.7 | 0.3 | 0 | 1 | 0 |
| 116 | Ca | Na | Ti | 0.7 | 0.3 | 0 | 1 | 0.01 |
| 117 | Ca | Na | Ti | 0.7 | 0.3 | 0 | 1 | 0.05 |
| *118 | Ca | Na | Ti | 0.7 | 0.3 | 0 | 1 | 0.06 |
| *119 | Ca | Na | Ti | 0.9 | 0 | 0 | 1 | 0.01 |
| *120 | — | — | — | 0.88 | 0.02 | 0 | 1 | 0 |
| 121 | Ca | Na | Ti | 0.88 | 0.02 | 0 | 1 | 0.01 |
| 122 | Ca | Na | Ti | 0.88 | 0.02 | 0 | 1 | 0.05 |
| *123 | Ca | Na | Ti | 0.88 | 0.02 | 0 | 1 | 0.06 |
| *124 | — | — | — | 0.75 | 0.15 | 0 | 1 | 0 |
| 125 | Ca | Na | Ti | 0.75 | 0.15 | 0 | 1 | 0.01 |
| 126 | Ca | Na | Ti | 0.75 | 0.15 | 0 | 1 | 0.05 |
| *127 | Ca | Na | Ti | 0.75 | 0.15 | 0 | 1 | 0.06 |
| *128 | — | — | — | 0.6 | 0.3 | 0 | 1 | 0 |
| 129 | Ca | Na | Ti | 0.6 | 0.3 | 0 | 1 | 0.01 |
| 130 | Ca | Na | Ti | 0.6 | 0.3 | 0 | 1 | 0.05 |
| *131 | Ca | Na | Ti | 0.6 | 0.3 | 0 | 1 | 0.06 |
| *132 | Ca | Na | Ti | 0.5 | 0.4 | 0 | 1 | 0.01 |
| *133 | — | — | — | 0.73 | 0.02 | 0 | 1 | 0 |
| 134 | Ca | Na | Ti | 0.73 | 0.02 | 0 | 1 | 0.01 |
| 135 | Ca | Na | Ti | 0.73 | 0.02 | 0 | 1 | 0.05 |
| *136 | Ca | Na | Ti | 0.73 | 0.02 | 0 | 1 | 0.06 |
| *137 | — | — | — | 0.6 | 0.15 | 0 | 1 | 0 |

TABLE 3

| Sample No. | M1 | M2 | M3 | x mol | y mol | z mol | m mol | n mol |
|---|---|---|---|---|---|---|---|---|
| 138 | Bi | Na | Ti | 0.6 | 0.15 | 0 | 1 | 0.01 |
| 139 | Bi | Na | Ti | 0.6 | 0.15 | 0 | 1 | 0.05 |
| *140 | Bi | Na | Ti | 0.6 | 0.15 | 0 | 1 | 0.06 |
| *141 | — | — | — | 0.45 | 0.3 | 0 | 1 | 0 |
| 142 | Bi | Na | Ti | 0.45 | 0.3 | 0 | 1 | 0.01 |
| 143 | Bi | Na | Ti | 0.45 | 0.3 | 0 | 1 | 0.05 |
| *144 | Bi | Na | Ti | 0.45 | 0.3 | 0 | 1 | 0.06 |
| *145 | Bi | Na | Ti | 0.4 | 0.3 | 0 | 1 | 0.01 |
| *146 | — | — | — | 0.88 | 0.02 | 0.1 | 1 | 0 |
| 147 | Bi | Na | Ti | 0.88 | 0.02 | 0.1 | 1 | 0.01 |
| 148 | Bi | Na | Ti | 0.88 | 0.02 | 0.1 | 1 | 0.05 |
| *149 | Bi | Na | Ti | 0.88 | 0.02 | 0.1 | 1 | 0.06 |
| *150 | — | — | — | 0.88 | 0.02 | 0.3 | 1 | 0 |
| 151 | Bi | Na | Ti | 0.88 | 0.02 | 0.3 | 1 | 0.01 |
| 152 | Bi | Na | Ti | 0.88 | 0.02 | 0.3 | 1 | 0.05 |
| *153 | Bi | Na | Ti | 0.88 | 0.02 | 0.3 | 1 | 0.06 |
| *154 | Bi | Na | Ti | 0.88 | 0.02 | 0.4 | 1 | 0.01 |
| *155 | — | — | — | 0.88 | 0.02 | 0 | 0.99 | 0 |
| 156 | Bi | Na | Ti | 0.88 | 0.02 | 0 | 0.99 | 0.01 |
| 157 | Bi | Na | Ti | 0.88 | 0.02 | 0 | 0.99 | 0.05 |
| *158 | Bi | Na | Ti | 0.88 | 0.02 | 0 | 0.99 | 0.06 |
| *159 | — | — | — | 0.88 | 0.02 | 0 | 0.98 | 0 |
| 160 | Bi | Na | Ti | 0.88 | 0.02 | 0 | 0.98 | 0.01 |
| 161 | Bi | Na | Ti | 0.88 | 0.02 | 0 | 0.98 | 0.05 |
| *162 | Bi | Na | Ti | 0.88 | 0.02 | 0 | 0.98 | 0.06 |
| *163 | Bi | Na | Ti | 0.88 | 0.02 | 0 | 0.97 | 0.01 |
| 164 | Bi | Li | Ti | 0.88 | 0.02 | 0 | 1 | 0.01 |
| 165 | Bi | Li | Ti | 0.88 | 0.02 | 0 | 1 | 0.05 |
| *166 | Bi | Li | Ti | 0.88 | 0.02 | 0 | 1 | 0.06 |
| 167 | Bi | Na | Zr | 0.88 | 0.02 | 0 | 1 | 0.01 |
| 168 | Bi | Na | Zr | 0.88 | 0.02 | 0 | 1 | 0.05 |
| *169 | Bi | Na | Zr | 0.88 | 0.02 | 0 | 1 | 0.06 |

Relative dielectric constant, electromechanical coupling coefficient in vibration in the thickness direction represented by $K_t$, resonance frequency constant of vibration in a thickness direction represented by N, temperature-dependent factor of resonance frequency of vibration in a thickness direction represented by fr-TC and Curie point were measured for the obtained samples shown in Table 2 and 3. The results are shown in Tables 4 and 5.

TABLE 4

| Sample No. | Relative dielectric constant | Electro-mechanical coupling coefficient (%) | Resonance frequency constant of vibration (Hz · m) | Temperature-dependent factor of resonance frequency (ppm) | Curie point (° C.) |
|---|---|---|---|---|---|
| *101 | | | Poor Sintering | | |
| *102 | 105 | 42 | 3480 | 170 | 420 |
| 103 | 110 | 37 | 3480 | 90 | 375 |
| 104 | 125 | 32 | 3500 | 85 | 210 |
| *105 | 130 | 21 | 3620 | 85 | 180 |
| *106 | 90 | 48 | 3620 | 175 | 425 |
| 107 | 95 | 42 | 3710 | 95 | 410 |
| 108 | 100 | 40 | 3720 | 90 | 400 |
| 109 | 115 | 37 | 3750 | 90 | 285 |
| *110 | 125 | 26 | 3800 | 90 | 195 |
| *111 | 95 | 45 | 3640 | 200 | 435 |
| 112 | 110 | 41 | 3700 | 95 | 415 |
| 113 | 120 | 36 | 3725 | 90 | 280 |
| *114 | 120 | 20 | 3730 | 85 | 195 |
| *115 | 85 | 35 | 3580 | 250 | 440 |
| 116 | 90 | 34 | 3590 | 95 | 410 |
| 117 | 110 | 24 | 3610 | 95 | 295 |
| *118 | 110 | 16 | 3610 | 100 | 195 |
| *119 | | | Poor sintering | | |
| *120 | 110 | 48 | 3420 | 220 | 400 |
| 121 | 115 | 44 | 3425 | 100 | 395 |

TABLE 4-continued

| Sample No. | Relative dielectric constant | Electro-mechanical coupling coefficient (%) | Resonance frequency constant of vibration (Hz · m) | Temperature-dependent factor of resonance frequency (ppm) | Curie point (° C.) |
|---|---|---|---|---|---|
| 122 | 125 | 39 | 3430 | 95 | 260 |
| *123 | 140 | 30 | 3450 | 85 | 185 |
| *124 | 105 | 40 | 3405 | 260 | 410 |
| 125 | 110 | 34 | 3420 | 95 | 400 |
| 126 | 120 | 27 | 3425 | 95 | 275 |
| *127 | 120 | 21 | 3445 | 90 | 185 |
| *128 | 105 | 38 | 3400 | 255 | 410 |
| 129 | 115 | 34 | 3450 | 95 | 370 |
| 130 | 120 | 23 | 3485 | 90 | 270 |
| *131 | 125 | 18 | 3490 | 85 | 180 |
| *132 | | | Poor sintering | | |
| *133 | 165 | 38 | 3200 | 310 | 400 |
| 134 | 165 | 28 | 3200 | 100 | 360 |
| 135 | 175 | 23 | 3220 | 100 | 225 |
| *136 | 175 | 16 | 3260 | 100 | 150 |
| *137 | 150 | 40 | 3235 | 260 | 415 |

TABLE 5

| Sample No. | Relative dielectric constant | Electro-mechanical coupling coefficient (%) | Resonance frequency constant of vibration (Hz · m) | Temperature-dependent factor of resonance frequency (ppm) | Curie point (° C.) |
|---|---|---|---|---|---|
| 138 | 150 | 31 | 3245 | 95 | 395 |
| 139 | 155 | 27 | 3260 | 95 | 300 |
| *140 | 160 | 22 | 3270 | 90 | 190 |
| *141 | 110 | 37 | 3300 | 195 | 425 |
| 142 | 120 | 32 | 3310 | 100 | 390 |
| 143 | 130 | 27 | 3415 | 95 | 325 |
| *144 | 130 | 21 | 3385 | 100 | 195 |
| *145 | 210 | 39 | 3065 | 100 | 390 |
| *146 | 130 | 45 | 3220 | 260 | 355 |
| 147 | 130 | 38 | 3225 | 95 | 325 |
| 148 | 140 | 35 | 3230 | 95 | 205 |
| *149 | 160 | 30 | 3270 | 95 | 165 |
| *150 | 160 | 47 | 3205 | 245 | 270 |
| 151 | 180 | 40 | 3165 | 100 | 235 |
| 152 | 180 | 30 | 3155 | 95 | 205 |
| *153 | 185 | 25 | 3140 | 95 | 150 |
| *154 | 180 | 35 | 3035 | 100 | 165 |
| *155 | 110 | 49 | 3420 | 220 | 395 |
| 156 | 120 | 46 | 3410 | 95 | 395 |
| 157 | 145 | 39 | 3405 | 90 | 285 |
| *158 | 160 | 32 | 3400 | 90 | 180 |
| *159 | 110 | 47 | 3400 | 220 | 390 |
| 160 | 120 | 41 | 3410 | 100 | 385 |
| 161 | 130 | 38 | 3405 | 90 | 275 |
| *162 | 135 | 26 | 3405 | 85 | 195 |
| *163 | | | Poor sintering | | |
| 164 | 105 | 44 | 3325 | 95 | 395 |
| 165 | 110 | 39 | 3335 | 95 | 245 |
| *166 | 120 | 28 | 3345 | 90 | 180 |
| 167 | 120 | 40 | 3375 | 95 | 400 |
| 168 | 135 | 33 | 3395 | 90 | 250 |
| *169 | 140 | 29 | 3420 | 85 | 185 |

In Tables 2 to 5, samples marked with * fall outside the scope of the present invention.

The samples satisfying all the following conditions in Tables 2 and 3: $x \leq 0.9$; $0.02 \leq y \leq 0.3$; $0.75 \leq x+y$; $0 \leq z \leq 0.3$; $0.98 \leq m \leq 1.0$; and $0 < n \leq 0.05$, exhibit excellent characteristics. Briefly, as shown in Tables 4 and 5, all samples according to the present invention (those not marked with *) have a relative dielectric constant of 180 or less, a resonance frequency constant of vibration in a thickness direction of 3000 Hz·m or more, a temperature-dependent factor of resonance frequency of 100 ppm or less and a Curie point of more than 200° C.

In contrast, Sample Nos. 101, 119, and 132, which fail to satisfy either the condition $x \leq 0.9$ or the condition $0.02 \leq y \leq 0.3$, exhibited poor sinterability.

Sample No. 145, which does not satisfy the condition $0.75 \leq x+y$, has a relative dielectric constant of 210 and thus does not attain a relative dielectric constant of 180 or less.

Sample No. 154, which does not satisfy the condition $0 \leq z \leq 0.3$, has a Curie point of 165° C. and thus does not attain a Curie point of more than 200° C.

Sample No. 163, which does not satisfy the condition $0.98 \leq m \leq 1.0$, does not attain desirable polarization.

Among the samples which do not satisfy the condition $0 < n \leq 0.05$, Sample Nos. 105, 110, 114, 118, 123, 127, 131, 136, 140, 144, 149, 153, 158, 162, 166 and 169 having an n of greater than 0.05 have a Curie point of 200° C. or less, and Sample Nos. 102, 106, 111, 115, 120, 124, 128, 133, 137, 141, 146, 150, 155 and 159 having an n of 0 have a temperature-dependent factor of resonance frequency in great excess of 100 ppm.

In Example 2, Bi was used as M1; Na or Li was used as M2, and Ti or Zr was used as M3. However, the inventors confirmed that equivalent effects can be realized when K is used as M2 and Sn and/or Hf are used as M3. Other trivalent metals, monovalent metals, and tetravalent metals may also be used as M1, M2 and M3, respectively.

As demonstrated by this Example, the second aspect of the present invention provides a piezoelectric ceramic composition exhibiting excellent characteristics; a relative dielectric constant of 180 or less and a temperature-dependent factor of resonance frequency of vibration in a thickness direction of 3000 Hz·m or more, proving that the composition can be advantageously used in a high frequency region. Moreover, the composition has a temperature-dependent factor of resonance frequency represented by fr-TC of 100 ppm or less and a Curie point of higher than 200° C. Therefore, by use of the piezoelectric ceramic composition according to the second aspect of the present invention, piezoelectric ceramic elements such as piezoelectric ceramic filters and piezoelectric ceramic oscillators are advantageously produced.

Although the present invention has been described above with reference to nonlimiting examples, those skilled in the art will recognize that many variations on the piezoelectric ceramic composition of the present invention are possible. Such variations are intended to be within the scope of the present invention.

What is claimed is:

1. A piezoelectric ceramic composition represented by the formula:

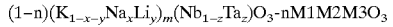

$(1-n)(K_{1-x-y}Na_xLi_y)_m(Nb_{1-z}Ta_z)O_3$-$nM1M2M3O_3$ wherein M1 represents a trivalent metal element; M2 represents a monovalent metal element; M3 represents a tetravalent metal element; and x, y, z, m, and n satisfy the following conditions: $0.9 \leq x$; $y \leq 0.3$; $x+y \leq 0.75$; $0 \leq z \leq 0.3$; $0.98 \leq m \leq 1.0$; and $0 < n < 0.1$.

2. A piezoelectric ceramic composition according to claim 1, wherein $0.1 \leq x$ and $x+y < 0.75$.

3. A piezoelectric ceramic composition according to claim 2, wherein M1 is Bi, M2 is at least one element selected from the group consisting of K, Na and Li, and M3 is at least one element selected from the group consisting of Ti, Zr, Sn and Hf.

4. A piezoelectric ceramic composition according to claim 3, wherein M2 is Na or Li, and M3 is Ti or Zr.

5. A piezoelectric ceramic composition according to claim 4, wherein M2 is Na and M3 is Ti.

6. A piezoelectric ceramic composition according to claim 1, wherein $x \leq 0.9$ and $0 < n \leq 0.05$ and $0.02 \leq y \leq 0.3$.

7. A piezoelectric ceramic composition according to claim 6, wherein M1 is Bi, M2 is at least one element selected from the group consisting of K, Na and Li, and M3 is at least one element selected from the group consisting of Ti, Zr, Sn and Hf.

8. A piezoelectric ceramic composition according to claim 7, wherein M2 is Na or Li, and M3 is Ti or Zr.

9. A piezoelectric ceramic composition according to claim 8, wherein M2 is Na and M3 is Ti.

* * * * *